United States Patent
Ryou

(10) Patent No.: US 7,136,406 B2
(45) Date of Patent: Nov. 14, 2006

(54) PSEUDOMORPHIC LAYER IN TUNNEL JUNCTION VCSEL

(75) Inventor: Jae-Hyun Ryou, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 382 days.

(21) Appl. No.: 10/611,992

(22) Filed: Jul. 3, 2003

(65) Prior Publication Data

US 2005/0002430 A1    Jan. 6, 2005

(51) Int. Cl.
*H01S 5/00* (2006.01)
*H01S 3/04* (2006.01)

(52) U.S. Cl. .............. 372/45.011; 372/43.01; 372/50.124

(58) Field of Classification Search ............ 372/45.011
See application file for complete search history.

(56) References Cited

U.S. PATENT DOCUMENTS

| | | | |
|---|---|---|---|
| 6,493,372 B1 | 12/2002 | Boucart et al. | |
| 6,493,373 B1 | 12/2002 | Boucart et al. | |
| 6,765,238 B1* | 7/2004 | Chang et al. | 257/104 |
| 2004/0161013 A1* | 8/2004 | Bour et al. | 372/96 |

OTHER PUBLICATIONS

Sekiguchi et al, Long Wavelength GaInAsP/InP laser with n—n contacts using AlAs/InP hole injecting tunnel junction, Jpn. J. Appl. Phys., Apr. 15, 199, vol. 38, pp. L443-L445.*

"Superlattice AlAs/AlInAs-oxide current aperture for long wavelength InP-based vertical-cavity surface-emitting laser structure", N. Ohnoki, et al., Applied Physics Letters, Nov. 30, 1998, vol. 73, No. 22, pp. 3262-3264.

"Long Wavelength GaInAsP/InP Laser with n—n Contacts Using AiAs/InP Hole Injecting Tunnel Junction", Shigeaki Sekiguchi, et al., Jpn. J. Appl. Phys., Apr. 15, 1999, vol. 38, pp. L443-L445.

* cited by examiner

*Primary Examiner*—Armando Rodriguez
(74) *Attorney, Agent, or Firm*—Workman Nydegger

(57) ABSTRACT

A vertical cavity surface emitting laser (VCSEL) includes an indium-based semiconductor alloy substrate, a first mirror stack over the substrate, an active region having a plurality of quantum wells over the first mirror stack, a tunnel junction over the active region, the tunnel junction including a p-doped pseudomorphically strained layer of a compound selected from the group consisting of Al-rich InAlAs, AlAs, Ga-rich InGaAs, GaAs and combinations thereof, and a second mirror stack over the tunnel junction. The pseudomorphically strained layer can be used to form a tunnel junction with a n-doped layer of InP or AlInAs, or with a lower bandgap material such as AlInGaAs or InGaAsP. Such tunnel junctions are especially useful for a long wavelength VCSEL.

17 Claims, 3 Drawing Sheets

PSEUDOMORPHIC LAYER IN TUNNEL JUNCTION VCSEL

BACKGROUND OF THE INVENTION

1. Field of the Invention

This invention relates to vertical cavity surface emitting lasers (VCSELs). More specifically, it relates to tunnel junctions for long-wavelength VCSELs.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Some VCSELs, particularly those used at long-wavelengths, incorporate tunnel junctions. Because of their complicated structure, and because of their material requirements, VCSELs are usually grown using metal-organic chemical vapor deposition (MOCVD).

FIG. 1 illustrates a typical long-wavelength VCSEL 10 having a tunnel junction. As shown, an n-doped InP substrate 12 has an n-type electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is a tunnel junction 28. Over the tunnel junction 28 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40.

In operation, an external bias causes an electrical current 21 to flow from the electrical contact 26 toward the electrical contact 14. The insulating region 40 and the conductive central opening 42 confine the current 21 such that the current flows through the conductive central opening 42 and into the tunnel junction 28. The tunnel junction converts incoming electrons into holes that are injected into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the conduction layer 9, the cap layer 8, an aperture 30 in electrical contact 26, and out of the surface of the vertical cavity surface emitting laser 10.

It should be understood that FIG. 1 illustrates a typical long-wavelength VCSEL having a tunnel junction, and that numerous variations are possible. For example, the dopings can be changed (say, by providing a p-type substrate), different material systems can be used, operational details can be tuned for maximum performance, and additional structures and features can be added.

While generally successful, VCSELs similar to that illustrated in FIG. 1 have problems. One problem in realizing commercial quality long wavelength VCSELs, which is addressed by the tunnel junction 28, is optical loss. In long wavelength VCSELs, it is often critical to limit optical losses. To that end, p-doped materials, which absorb more light than n-doped materials, are replaced by n-doped materials and the tunnel junction 28. That junction converts electron currents into hole currents that are injected into the active region. That way, long wavelength VCSELs can be made with a non-absorbing n-type mirror on both the top and the bottom.

Tunnel junctions used in semiconductor lasers are thin (say 10 nanometer), reversed biased structures. Such tunnel junctions are usually n++/p++ structures in which the p-region has a high doping density using a low diffusivity dopant. This enables a low voltage drop, low free carrier absorption and sufficient free carriers in the semiconductor lasers. Dopants for such tunnel junctions should provide a high doping level in semiconductor matrix and should not diffuse around so as to maintain a sharp doping profile. Because of their low diffusivity, silicon and carbon are used for n-type and p-type dopants in tunnel junctions, respectively, especially for non-indium containing GaAs based VCSELs. For Indium-Alloy-based VCSELs, which are more pertinent to long-wavelength VCSELs, however, high doping density for p-type using carbon is, however, difficult to obtain. For example, p-type doping density of AlInAs lattice matched to InP with conventional doping techniques is less than $2\times10^{19}$ cm$^{-3}$, which is an amount of doping density for a good tunnel junction with a low voltage drop.

SUMMARY OF THE INVENTION

Accordingly, the present invention is directed to a tunnel junction suitable for use in long wavelength VCSELs that substantially obviates one or more of the problems due to limitations and disadvantages of the prior art.

An advantage of the present invention is to provide a tunnel junction for an InP-based VCSEL that utilizes a pseudomorphically strained layer such as Al-rich InAlAs (or binary AlAs) or Ga-rich InGaAs (or binary GaAs). A tunnel junction according to the principles of the present invention includes such a pseudomorphic layer and an n-doped layer of InP, AlInAs, or of a lower bandgap material such as AlInGaAs or InGaAsP. Beneficially, such a tunnel junction is formed above quantum wells to form a VCSEL. Such VCSELs are particularly advantageous at long wavelengths.

A VCSEL having a tunnel junction constructed according to the principles of the present invention has a high p-doping density (for example, higher than $1\times10^{19}$ cm$^{-3}$) for the p-side of the tunnel junction, and has a high carrier mobility in the tunnel junction because of an in-plane tensile strain applied to the p-layer of the tunnel junction. Moreover, carrier-tunneling behavior is improved in the tunnel junction, because hydrostatic strain in the p-side layer of the tunnel junction makes the bandgap of the p-side layer of the tunnel junction smaller in comparison with those of the conventional tunnel junctions.

In order to achieve these and other advantages and in accordance with the purpose of the present invention, as embodied and broadly described, a vertical cavity surface emitting laser may, for example, include an indium-based semiconductor alloy substrate; a first mirror stack over the substrate; an active region having a plurality of quantum wells over the first mirror stack; a tunnel junction over the active region, the tunnel junction including a p-doped pseudomorphically strained layer of a compound selected from the group consisting of Al-rich InAlAs, AlAs, Ga-rich InGaAs, GaAs or combinations thereof; and a second mirror stack over the tunnel junction.

In another aspect of the present invention, a tunnel junction may, for example, include a p-doped pseudomorphically strained layer, wherein the p-doped pseudomorphically strained layer includes a compound selected from the group consisting of Al-rich InAlAs, AlAs, Ga-rich InGaAs, GaAs and combinations thereof.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
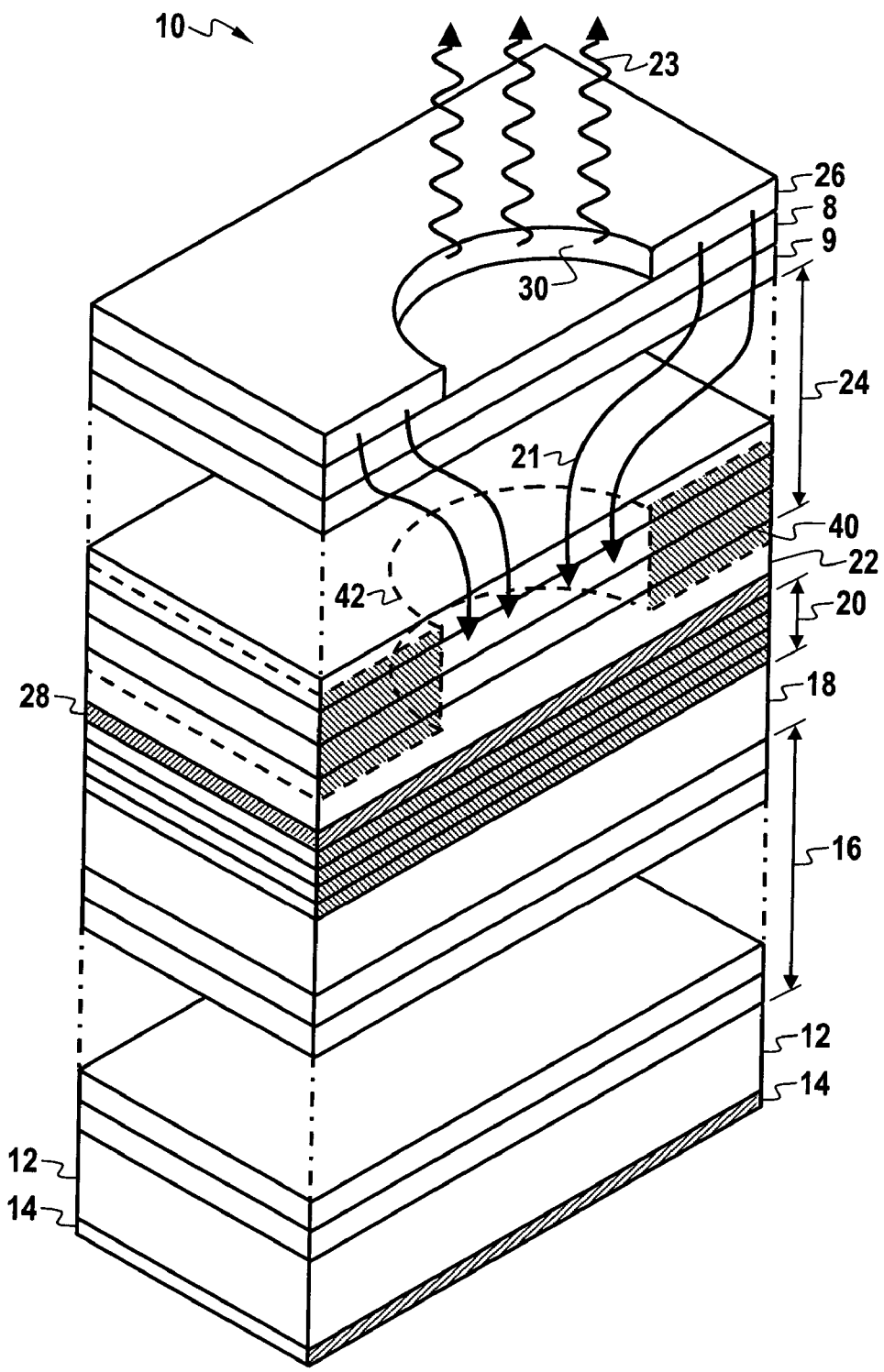
FIG. 1 illustrates a typical long-wavelength vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

The principles of the present invention are incorporated in a first embodiment VCSEL having a bottom AlGaInAs/AlInAs DBR mirror grown on an InP substrate. An example of such a VCSEL is the VCSEL 100 illustrated in FIG. 2.

Figure 2:
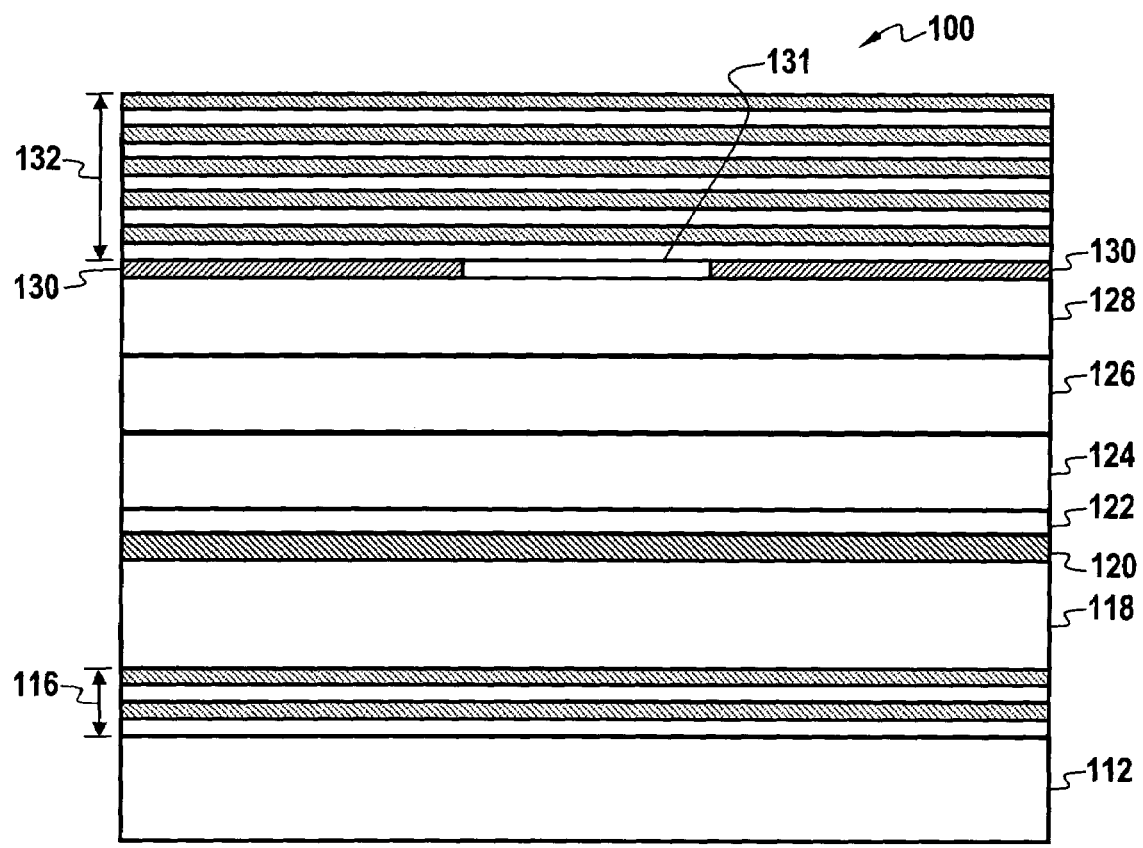
FIG. 2 illustrates a vertical cavity surface emitting laser that is in accord with the principles of the present invention.

As shown in FIG. 2, the VCSEL 100 includes an n-doped InP substrate 112 having an n-type electrical contact (not shown for clarity). Over the InP substrate 112 is an n-doped lower mirror stack 116 (a DBR) comprised of a plurality of alternating layers of AlGaInAs/AlInAs, InAlGaAs/InP or InGaAsP/InP. Over the lower mirror stack 116 is an n-doped InP spacer 118. The lower mirror stack 116 is beneficially grown on the InP substrate using, for example, common metal-organic and hydride sources like TMAl, TMGa, $PH_3$ and $AsH_3$ in an MOCVD process. Then, the InP spacer 118 is grown, also using MOCVD. An active region 120 comprised of P-N junction structures and having a large number of quantum wells is then formed over the InP spacer 118. The composition of the active region 120 is beneficially InGaAsP or AlInGaAs. Over the active region 120 is a p-type InP top spacer 121. Similar to the lower InP spacer 118, the p-type InP top spacer 121 is also grown using MOCVD.

Figure 3:
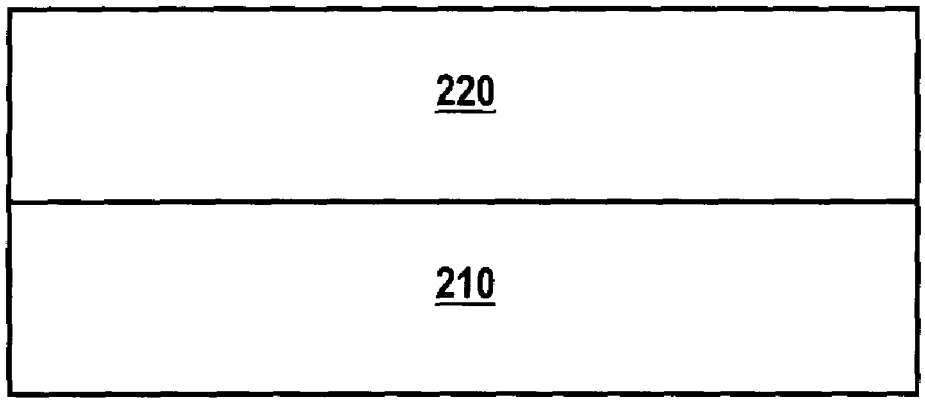
FIG. 3 illustrates a tunnel junction structure in the VCSEL illustrated in FIG. 2 that is in accord with the principles of the present invention.
Figure 4:
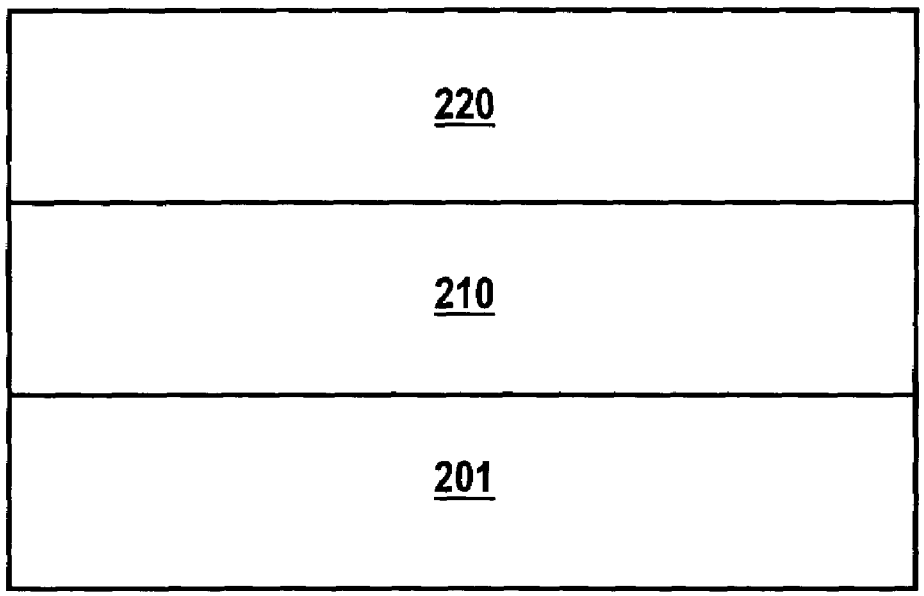
FIG. 4 illustrates another tunnel junction structure in the VCSEL illustrated in FIG. 2 that is in accord with the principles of the present invention.

Referring to FIG. 2, FIG. 3 and FIG. 4, over the p-type InP top spacer 121 is a tunnel junction 122 comprised of a reverse biased n++/p++ junction. The tunnel junction includes a p-layer comprised of a pseudomorphically strained layer 210 such as Al-rich InAlAs (or binary AlAs) or Ga-rich InGaAs (or binary GaAs). The pseudomorphically strained layer 210 can be grown by conventional growing methods of InAlAs (or AlAs) layers or InGaAs (or GaAs) layers in the VCSEL technologies, such as MOCVD (Metal Organic Chemical Vapor Deposition) and MBE (Molecular Beam Epitaxy). The growth temperature is between 400° C. and 900° C. The growth rate can be easily controlled by adjusting group III source input. Doping is beneficially performed using $CCl_4$ or $CBr_4$ such that the resulting p-doping is greater than $1 \times 10^{19}$ $cm^{-3}$. The thickness of the pseudomorphically strained layer 210 should be smaller than a critical thickness, which is dependent upon the materials used and the extent of strain, which is further dependent upon the growing method and conditions of the pseudomorphically strained layer. A lattice-matched Zn doped layer 201 can replace some portion of the p-layer of the tunnel junction in order to increase the critical thickness. In this case, the lattice-matched Zn doped layer 201 and the pseudomorphically strained layer 210 constitute the p-side of the tunnel junction 122, as shown in FIG. 4.

Still referring to FIG. 2, FIG. 3 and FIG. 4, the tunnel junction 122 further includes an n-doped layer 220 of InP, AlInAs, or of a lower bandgap material such as AlInGaAs or InGaAsP. The n-doped layer 220 should also be heavily doped (greater than $5 \times 10^{19}$ $cm^{-3}$) and very thin (less than about 10 nanometers). For a good lattice matching, the VCSEL 100 uses an InP n-type layer in the tunnel junction 122.

Over the tunnel junction 122 is an n-type top mirror structure (which includes another DBR). As in the case of the lower mirror stack 116, the n-type top mirror stack 132 is beneficially comprised of a plurality of alternating layers of AlGaInAs/AlInAs, InAlGaAs/InP or InGaAsP/InP, and is beneficially grown using MOCVD. As shown in FIG. 2, an insulating structure 130 may be optionally provided between the tunnel junction 122 and the n-type top mirror stack 132. The insulating structure includes an opening 131, which enables current flow through the VCSEL 100. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) may be provided to complete the VCSEL 100.

The VCSEL 100 having the pseudomorphically strained layer 210 in the tunnel junction 122 has significant advantages over prior art long wavelength InP VCSELs. First, since a high p-doping density (higher than $1 \times 10^{19}$ $cm^{-3}$) is obtainable for the p-side of the tunnel junction with the carbon doping techniques, there is a lower voltage drop across the tunnel junction portion 122 in the VCSEL 100 as compared with the conventional long wavelength VCSELs. Another advantage is that the bandgap on the p-side of the tunnel junction 122 is modified in a beneficial way in terms of carrier tunneling behavior such that the extent of the voltage drop across the tunnel junction 122 in the VCSEL 100 can be further reduced. For example, a hydrostatic strain induced in the less-indium containing layer (the pseudomorphically strained layer 210) with a smaller lattice constant than other lattice-matched layers makes the bandgap on the p-side smaller as compared with the tunnel junctions of the conventional long wavelength VCSELs. Yet another advantage is a higher carrier mobility in the tunnel junction 122 due to an in-plane tensile strain applied to the p-side of the tunnel junction as compared with the tunnel junctions of the conventional long wavelength VCSELs. The overall result is a VCSEL with improved performance.

It should be understood that, while a tunnel junction according to the principles of the present invention is described in this section with a long wavelength VCSEL device, it could be used with other types of VCSEL or other devices for its intended purposes herein described. It should be further understood that, while a tunnel junction is provided over the active region 120 in this section, the number and/or location of the tunnel junction could be varied in VCSELs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser, comprising:
   an indium-based semiconductor alloy substrate;
   a first mirror stack over the substrate;
   an active region having a plurality of quantum wells over the first mirror stack;
   a tunnel junction over the active region, the tunnel junction having an n-side
   including an n-doped layer, and a p-side including a p-doped pseudomophically strained layer of a compound selected from the group consisting of Al-rich 1nAlAs, AlAs, Ga-rich InGaAs, GaAs and combinations thereof, wherein the p-doped layer has an in-plane tensile strain so as to increase a carrier mobility in the tunnel junction and a hydrostatic strain so as to reduce a bandgap of the p-side layer; and
   a second mirror stack over the tunnel junction.

2. A vertical cavity surface emitting laser according to claim 1, wherein the p-side of the tunnel junction further includes a lattice matched Zn doped layer.

3. A vertical cavity surface emitting laser according to claim 1, further including an n-type spacer adjacent the active region, and wherein the first mirror stack is an n-type DBR.

4. A vertical cavity surface emitting laser according to claim 1, further including an n-type spacer adjacent the tunnel junction, and wherein the second mirror stack is an n-type DBR.

5. A vertical cavity surface emitting laser according to claim 1, further including:
   an n-type bottom spacer adjacent the active region, and wherein the first mirror stack is an n-type DBR; and
   an p-type top spacer adjacent the tunnel junction,
   wherein the first and second mirror stacks are each an n-type DBR.

6. A vertical cavity surface emitting laser according to claim 1, wherein the p-doped pseudomorphically strained layer is grown by MOCVD or MBE.

7. A vertical cavity surface emitting laser according to claim 6, wherein the p-doped pseudomorphically strained layer is doped with carbon with a concentration greater than $1 \times 10^{19}$ cm$^{-3}$.

8. A vertical cavity surface emitting laser according to claim 1, wherein the active region includes one of InGaAsP and AlInGaAs.

9. A vertical cavity surface emitting laser according to claim 1, wherein the tunnel junction further includes an n-doped layer of a compound in the group consisting of InP, AlInAs, AlInGaAs, or InGaAsP.

10. A vertical cavity surface emitting laser according to claim 1, wherein the first and second mirror stacks are lower and upper mirror stacks, respectively.

11. A tunnel junction having a p-doped pseudomorphically strained layer, wherein the p-doped pseudomorphically strained layer includes a compound in the group consisting of Al-rich InAlAs, AlAs, Ga-rich InGaAs, GaAs and combinations thereof and, wherein the p-doped strained layer has an in-plane tensile strain so as to increase a can'ier mobility in the tunnel junction and a hydrostatic strain so as to reduce a bandgap of a p-side layer of the tunnel junction.

12. A tunnel jtlnction according to claim 11, further including a lattice matched Zn doped layer.

13. A tunnel junction according to claim 11, wherein the p-doped pseudomorphically strained layer is doped with carbon with a concentration greater than $1 \times 10^{19}$ cm$^{-3}$.

14. A tunnel junction according to claim 11, further including an n-doped layer of a compound in the group consisting of InP, AlInAs, AlInGaAs, and InGaAsP.

15. A tunnel junction according to claim 14, wherein the n-doped layer is doped with a concentration greater than $5 \times 10^{19}$ cm$^{-3}$.

16. A tunnel junction according to claim 14, wherein the n-doped layer is less than about 10 nanometers thick.

17. A tunnel junction according to claim 14, wherein the n-doped layer is doped with a concentration greater than $5 \times 10^{19}$ cm$^{-3}$ and the n-doped layer is less than about 10 nanometers thick.

* * * * *

UNITED STATES PATENT AND TRADEMARK OFFICE
CERTIFICATE OF CORRECTION

PATENT NO. : 7,136,406 B2 Page 1 of 1
APPLICATION NO. : 10/611992
DATED : November 14, 2006
INVENTOR(S) : Jae-Hyun Ryou It is certified that error appears in the above-identified patent and that said Letters Patent is hereby corrected as shown below:

Column 3
Line 45, after "drawings", remove [that]

Column 6
Line 10 claim 5, before "p-type" change "an" to --a--
Line 27 claim 9, change "AIInGaAs" to --AlInGaAs--
Line 40 claim 12, change "jtlnction" to --junction--

Signed and Sealed this

Fifth Day of August, 2008

JON W. DUDAS
*Director of the United States Patent and Trademark Office*